United States Patent
Leggett

(10) Patent No.: US 9,777,583 B2
(45) Date of Patent: Oct. 3, 2017

(54) EROSION RESISTANT COATING

(71) Applicant: ROLLS-ROYCE PLC, London (GB)

(72) Inventor: Andrew Jonathan Leggett, Derby (GB)

(73) Assignee: ROLLS-ROYCE PLC, London (GB)

( * ) Notice: Subject to any disclaimer, the term of this patent is extended or adjusted under 35 U.S.C. 154(b) by 646 days.

(21) Appl. No.: 14/182,675

(22) Filed: Feb. 18, 2014

(65) Prior Publication Data

US 2014/0271220 A1 Sep. 18, 2014

(30) Foreign Application Priority Data

Mar. 12, 2013 (GB) .................................. 1304403.7

(51) Int. Cl.
| | |
|---|---|
| *C23C 10/02* | (2006.01) |
| *C23C 10/28* | (2006.01) |
| *C23C 16/06* | (2006.01) |
| *C09D 5/08* | (2006.01) |
| *F01D 5/28* | (2006.01) |
| *F01D 5/30* | (2006.01) |

(52) U.S. Cl.
CPC .............. *F01D 5/288* (2013.01); *C23C 10/02* (2013.01); *C23C 10/28* (2013.01); *C23C 16/06* (2013.01); *F01D 5/3092* (2013.01); *F05D 2300/143* (2013.01)

(58) Field of Classification Search
CPC .......... C23C 4/08; C23C 10/02; C23C 10/28; C23C 16/06; C09D 5/084; F01D 5/288; F01D 5/3092; F05D 2300/143
USPC ............... 106/1.15, 1.21, 1.28, 14.05, 14.21; 420/466; 427/383.7; 252/387
See application file for complete search history.

(56) References Cited

U.S. PATENT DOCUMENTS

| | | | | |
|---|---|---|---|---|
| 5,482,578 | A | * | 1/1996 | Rose ....................... C23C 10/02 427/383.1 |
| 5,667,663 | A | * | 9/1997 | Rickerby .............. C23C 14/083 148/277 |
| 5,942,337 | A | * | 8/1999 | Rickerby ................ C23C 10/58 148/518 |
| 6,565,931 | B1 | | 5/2003 | Rickerby et al. |
| 6,589,668 | B1 | | 7/2003 | Braithwaite et al. |
| 7,229,701 | B2 | * | 6/2007 | Madhava ................ F01D 5/288 427/383.7 |
| 2005/0145503 | A1 | | 7/2005 | Kozlov et al. |
| 2006/0046091 | A1 | | 3/2006 | Madhava et al. |

(Continued)

FOREIGN PATENT DOCUMENTS

| | | |
|---|---|---|
| EP | 0 814 178 A1 | 12/1997 |
| EP | 1 916 319 A2 | 4/2008 |

OTHER PUBLICATIONS

EPO Written Opinion mailed Jul. 8, 2014 for EP Patent Application 14155591; 4 pages.*

(Continued)

*Primary Examiner* — Helene Klemanski
(74) *Attorney, Agent, or Firm* — Oliff PLC

(57) ABSTRACT

A platinum plus chromium coating applied to the roots and firtrees of turbine blades where the inclusion of chromium creates a single phase outer zone which minimizes diffusion paths for sulphur which can preferentially diffuse down phase boundaries and enables a chromium rich outer oxide scale to form on top of the coating.

12 Claims, 4 Drawing Sheets

(56) References Cited

U.S. PATENT DOCUMENTS

2006/0141283 A1    6/2006   Madhava
2008/0102306 A1*   5/2008   Gorman .................. C23C 14/16
                                                                                                        428/632

OTHER PUBLICATIONS

Search Report issued in European Patent Application No. 14 15 5591 dated Jun. 23, 2014.
Search Report issued in British Application No. 1304403.7 dated Sep. 12, 2013.

* cited by examiner

EROSION RESISTANT COATING

TECHNICAL FIELD OF INVENTION

The present invention relates to environmental protection coatings and particularly environmental protection coatings that are used on the roots and shanks of gas turbine blades.

BACKGROUND OF INVENTION

Turbine blades used in gas turbine engines can suffer corrosion which limits the life of the component in the harsh conditions in which the turbine blade operates. Sulphidation is one form of corrosion to which the blade is susceptible and which can require early removal of the blade from the engine.

Turbine blades are typically nickel, cobalt or iron based superalloys and conventional environmental protection coatings include silicide modified aluminide coatings or chromised coatings for lower temperature Type 2 corrosion resistance.

In one coating described in U.S. Pat. No. 6,565,931 a diffused platinum coating is applied to turbine blade aerofoils and root shanks via an electroplating process and heat treated at 1100° C. to 1150° C. Applicable to Nickel based super-alloys, the coating is used as either an aerofoil bond coat or for sulphidation protection on the shanks of turbine blade roots. The platinum coating has three layers with the outer layer comprising both a gamma phase and a gamma prime phase. The outer layer of the metallic article may comprise a controlled of chromium in quantities of about 3% with an increasing level of 3-6% and 6.5% for the intermediate and inner zone respectively. At these levels of chromium it has been found that the outer layer remains as a two phase layer.

Service inspections and laboratory testing have shown that the coatings whilst providing good corrosion protection are unable to provide sufficient corrosion protection for the modern large civil engines that have entered service over the last five years. This has led to blade lives having to be limited by sulphidation cracking that occurs once the coatings have been breached.

The diffused platinum coating that is limited by sulphidation cracking, has been shown to only provide moderate corrosion resistance under low salt fluxes. Further understanding of the coatings structure has shown the two phase gamma-gamma prime coating to be susceptible to attack down the phase boundaries within the coating. This is believed to be responsible for the variability in corrosion protection observed depending on the specific environmental conditions for each engine examined.

Another known process for increasing corrosion resistance is known as chromising, which is a process that increases the near surface level of chromium. For some of the older Ni based alloys this has been shown to offer an improvement in corrosion resistance under low to moderate corrosive environments. More recent turbine blade alloys, suitable for use in the majority of large civil engines including, have been shown to be incompatible with chromising, resulting in no improvement in corrosion protection. This was due to Tantalum, acting as an alloying element, which was found to concentrate in the diffusion front after chromising causing a decrease in expected life. Unexpectedly, the tantalum caused an increase in the rate of degradation due to corrosion.

Some corrosion resistant alloys include high quantities of aluminium that form a beta phase alloy. Beta phase alloys are generally brittle and may require frequent replacement and repair during service of the component It is an object of the present invention that seeks to provide an improved environmental coating.

STATEMENTS OF INVENTION

According to a first aspect of the invention there is provided an erosion protection coating for a turbine blade, the coating comprising platinum and chromium and having a single gamma phase outer zone.

Advantageously, the generated chromium enriched single phase outer zone does not have phase boundaries which avoids regions at which the atomic structure can change and that can cause strain due in part to a mismatch in elemental makeup Preferably the chromium comprises between 8 and 30 wt % of the single phase outer zone. The single phase outer zone may comprise between 8 and 20 wt % chromium. A high level of chromium promotes the formation of the single gamma phase outer zone.

Aluminium may also be present in the single phase outer zone comprises at levels of up to 9 wt % but preferably in amounts below 7.5%

The single phase outer zone may comprise between 9 and 23 wt % chromium.

The single phase outer zone preferably comprises between 25 to 60 wt % platinum.

The single phase outer zone preferably comprises between 20 to 40 wt % nickel.

The single phase outer zone preferably comprises between 0 to 5 wt % iron.

Preferably the single phase outer zone is between 4 and 30 microns thick. Preferably below 20 microns thick. Preferably above 10 microns thick and below 30 microns thick. Measurements are taken from the outer surface.

The maximum platinum diffusion zone is preferably no more than 40 microns thick.

According to a further aspect of the invention there is provided a nickel alloy turbine blade having an erosion protection coating according to any of the preceding ten paragraphs The turbine may have a root, wherein the erosion protection coating is applied to the root.

According to a further aspect of the invention there is provided a method of providing a coating on a nickel turbine blade comprising the steps of applying to the blade a coating of platinum, and heat treating to provide a platinum enriched outer layer with a thickness between 5 microns and 30 microns, and diffusing chromium into the platinum to form a single phase outer zone.

Preferably the heat treatment provides a platinum enriched outer layer that is between 5 and 11.5 microns following heat treatment.

The outer layer may comprise between 8 and 30 wt % chromium.

The heat treatment may comprise heating the blade to a temperature between 1000° C. and 1200° C. for 1 to 6 hours.

The chromium may be deposited by chemical vapour deposition at a temperature between 875° C. to 1200° C. for 1 to 12 hours.

DETAILED DESCRIPTION OF INVENTION

Figure 1:
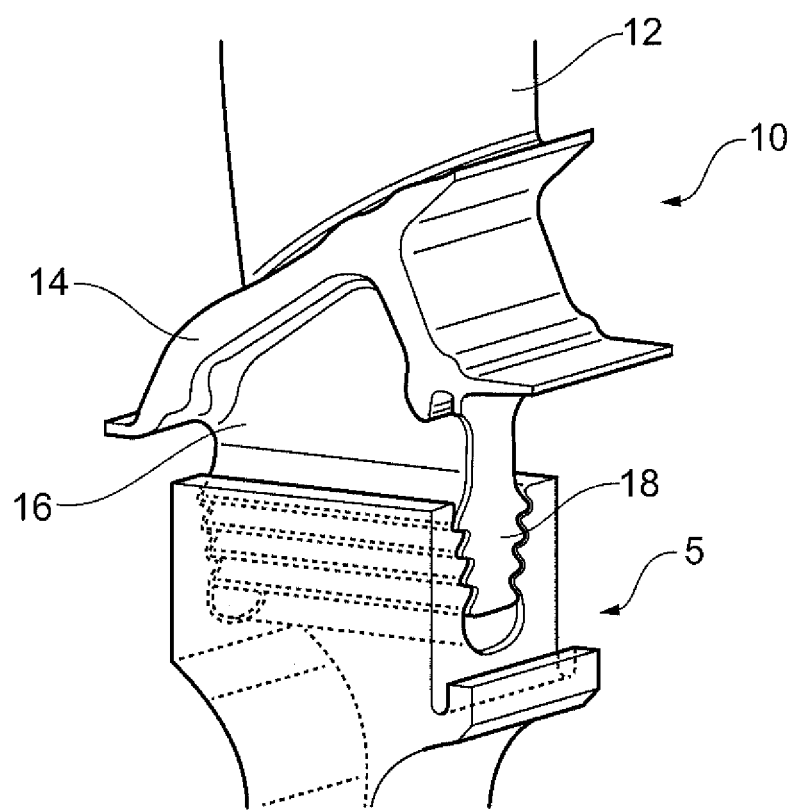
FIG. 1 depicts a turbine blade mounted into a slot on a disc.

FIG. 1 depicts a gas turbine engine blade 10 mounted in a root slot of a turbine disc 5. The blade comprises an aerofoil 12, a platform 14, a shank 16 and a root 18. The blade has internal cooling passages which carry cooling air in use to allow the blade to operate at high temperatures. The shank 16 and the root 18 of the turbine blade have a protective coating according to the present invention.

Figure 2:
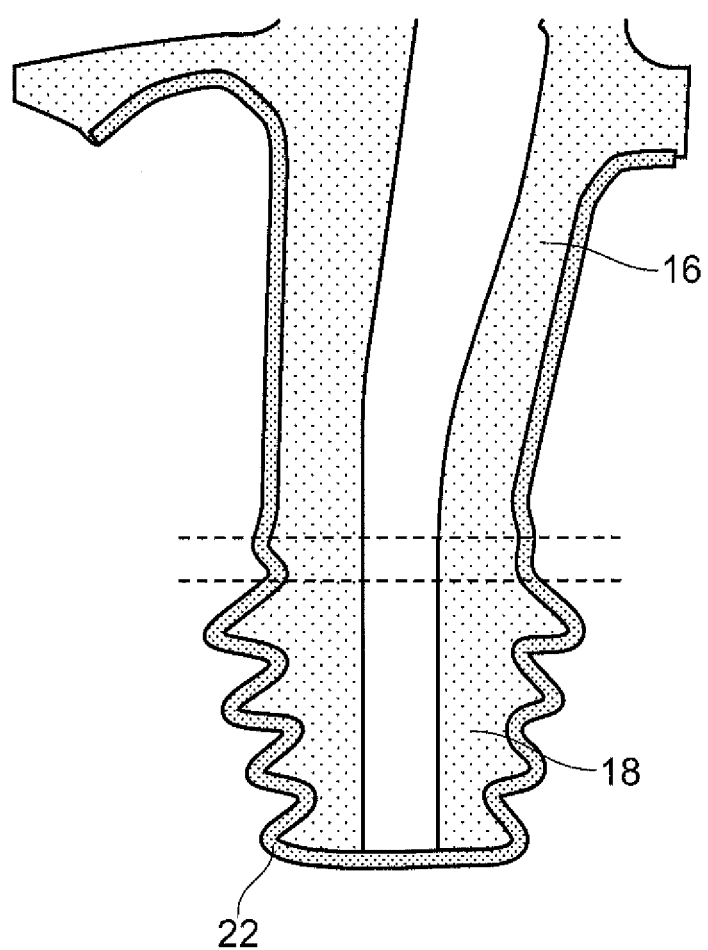
FIG. 2 depicts a blade root and shank having a coating in accordance with the invention.

FIG. 2 shows the coating on the blade shank and root in more detail. The coating 22 extends over at least the whole exterior surface of the root and shank to eliminates a demarcation line that is formed where the coating extends over the just the shank with the root uncoated. The demarcation line can provide an initiation point for stress cracking of the coating but it has been desirable with older coatings to leave the root uncoated as it can be damaged by contact with the disc slot.

The metallic turbine blade is manufactured from a nickel based superalloy, a cobalt based superalloy, or other based superalloy that comprises a gamma prime phase matrix and a gamma prime phase in the gamma phase matrix.

A platinum layer is deposited using a standard electroplating process. Alternatively, chemical vapour deposition, physical vapour deposition, e.g. sputtering, plasma assisted chemical vapour deposition, or any other suitable process may be used provided the thickness of the deposited coating is above a defined minimum and is conformal without pores or blistering.

The deposited platinum layer is subsequently heat treated at a temperature between 1000° C. and 1200° C. for 1 to 6 hours. This produces a two phase (gamma-gamma prime) coating. The heat treatment of a 7 micron thick layer of platinum into the nickel base superalloy results in a platinum enriched outer layer about 25 microns to 30 microns thick.

The heat treatment of a 4 micron thick layer of platinum into the nickel base superalloy results in a platinum enriched outer layer about 12 to 15 microns thick. It is preferred that a layer of platinum is deposited that is between 5 and 11.5 microns and generates a outer layer that is between 5 and 30 microns Following formation of the platinum layer a layer of chromium is deposited onto the platinum using a chemical vapour deposition process (CVD) to diffuse in 8 to 30 wt % chromium which interdiffuses the chromium with the platinum to form a single gamma phase structure. To achieve the desired interdiffusion the CVD process is run at 875° C. to 1200° C. for 1 to 12 hours.

Figure 3:
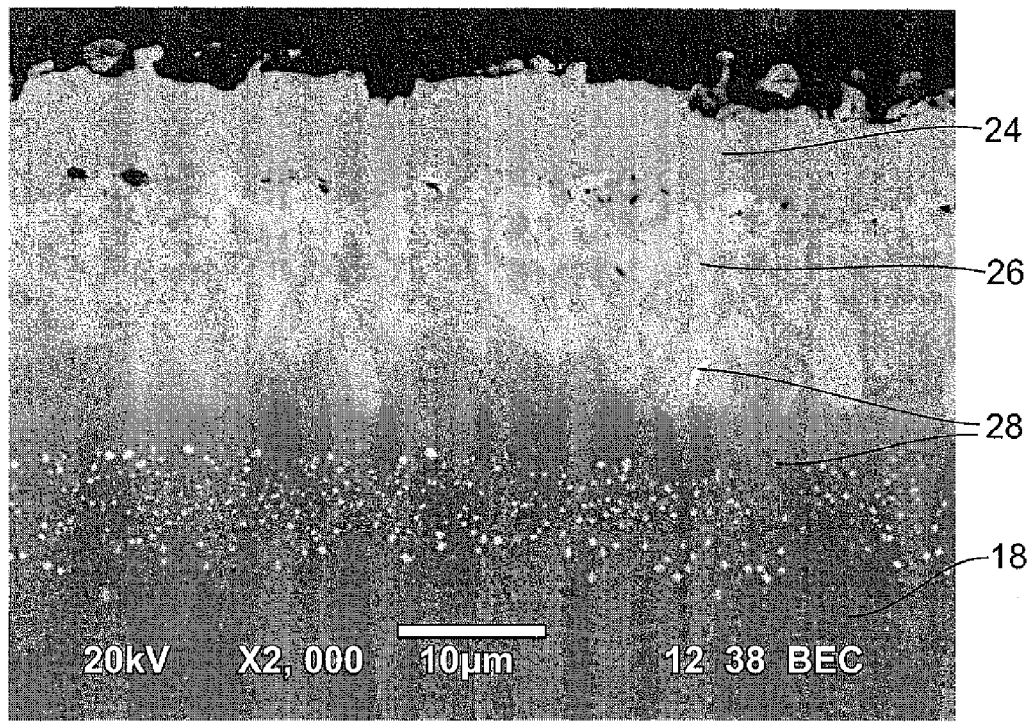
FIG. 3 shows a backscattered image showing a typical platinum chromium microstructure.

FIG. 3 depicts a backscattered image showing a typical unetched platinum chromium microstructure on a blade root formed from nickel alloy shown at 2000× magnification. The coating 22 on the blade root 18 has an chromium enriched outer zone 24 and a platinum enriched inner zone 26. Precipitates 28 of other metals e.g. tungsten, tantalum or rhenium can form within the platinum enriched inner layer.

Advantageously, the generated chromium enriched outer layer 24 does not have phase boundaries which avoids regions at which the atomic structure can change and that can cause strain due in part to a mismatch in elemental makeup. In a first embodiment the chromium enriched outer layer has a chemical make up that is: Pt in a range 25-60 wt %, Cr between 8 and 20 wt %, Al in the range of up to 9 wt %, Ni between 20 and 40 wt % and Fe between 0 and 5 wt %.

In an alternative embodiment the chromium enriched outer layer has a chemical make up that is: Pt in a range 25-60 wt %, Cr between 9 and 23 wt %, Al in the range of up to 7.5 wt %, Ni between 20 and 40 wt % and Fe between 0 and 5 wt %.

It has been found that sulphur is able to penetrate preferentially down phase boundaries penetrating through the bulk of the coating to the substrate. By removing the boundaries the corrosion resistance of the coating is improved. The platinum acts as a barrier to the inward diffusion of sulphur and the outward diffusion of substrate elements such as nickel and cobalt. The inclusion of Chromium to a level between 8 and 30% creates a single phase outer zone which minimises diffusion paths down which sulphur could diffuse preferentially and enables chromium rich outer oxide scale to form on top of the coating. The combination of platinum plus chromium acts to decrease inward and outward diffusion through the coating thereby improving the incubation life and corrosion resistance of the blade.

The chromium rich single phase layer thickness is not less than 4 microns but is more preferably between 10 and 20 microns. The maximum platinum diffusion zone following all heat treatment should be no more than 40 microns and is preferably in the range of 18 to 40 microns.

The coating described herein offers significant improvements in life by preventing the substrate from being attacked under corrosive conditions and degraded in a pitting manner from which cracks are known to initiate. The PtCr has better type II hot corrosion resistance compared to other coatings used throughout the aerospace industry, including diffused platinum, aluminising, chromising and CrAl. Mechanical testing has also shown the coating to have superior mechanical integrity. i.e the coating is more ductile than all other corrosion resistant coating systems used to protect against this form of corrosion.

This ductility is of particular benefit as it offers greater strain resistance against cracking. Advantageously, the coating can be specified for blade features i.e. firtrees that have otherwise been out of scope for current in service corrosion resistant coatings as the stresses in these locations would have caused the coatings to crack. The ability to coat blade shanks and firtrees offers further advantages of being able to reduce the extent of masking and elimination of demarcation lines between areas coated and uncoated.

One exemplary alloy has the following composition:

| Element | wt % |
| --- | --- |
| Al | 1.7 |
| Ti | 0.2 |
| Cr | 15 |
| Fe | 1.7 |
| Co | 5 |
| Ni | 26.9 |
| Nb | 0.6 |

-continued

| Element | wt % |
| --- | --- |
| Mo | 0.4 |
| Hf | 0.3 |
| Ta | 2 |
| W | 1.5 |
| Re | 1 |
| Pt | Balance |

Other elements such as palladium and/or iridium may be included in trace amounts.

Figure 4:
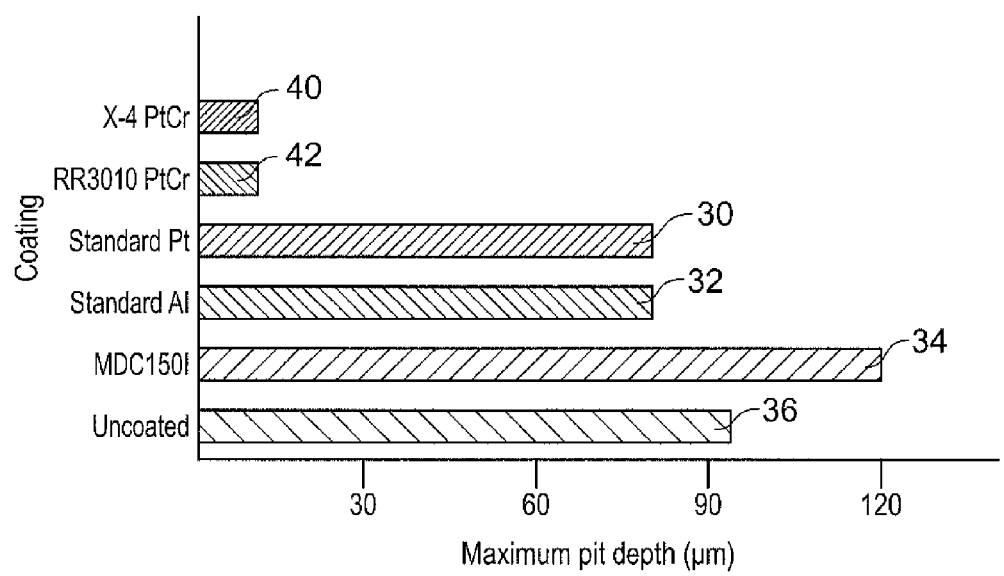
FIG. 4 depicts the maximum pit depth for a number of erosion protection coatings following a corrosion test.

FIG. 4 depicts the maximum pit depth for a range of corrosion resistant coatings applied to two nickel alloy turbine blade (RR3010 and X4) following hot corrosion testing. The coatings were elemental platinum 30, aluminide 32, MDC1501 34 which is a platinum aluminide coating supplied by HOWMET and two coatings 40, 42 manufactured in accordance with the invention with between 8 wt % and 30 wt % chromium diffused into the platinum. The pit depth of an uncoated 36 blade is also shown. Each of the blades were hot corrosion tested by applying a medium sea salt deposition flux (1.5 µg/cm2/h) on the candidate coatings with a total exposure time of 500 hours, at an exposure temperature of 700° C. The gas used in the controlled atmosphere furnace was chosen to simulate a hot corrosion environment, i.e. 300 vpm $SO_2$-air. As can be seen from the results the pit depth following the test is significantly less in the coatings of the present invention than in conventional coatings. The coating formed in accordance with the present invention offers at least a doubling of life improvement as well as offering a greater than 0.5% strain to crack improvement over the prior coatings.

The coating could be applied to other Ni based superalloys and is applicable to both HP and IP turbine blades. The coating could be used within the military, civil, industrial and energy based sectors where severe corrosion is limiting component lives.

The use of chromium rich putties offers an alternative technique for depositing chromium. The advantages include better control over where chromium is applied and a reduction in the level of masking as an external gas is not needed, as in CVD chromising, reducing processing time and cost.

The invention claimed is:

1. An erosion protection coating on a shank and a root of a gas turbine engine turbine blade that is (i) mounted in a root slot of a turbine disc and (ii) comprises an aerofoil, a platform, the shank, and the root, the coating having a single gamma phase outer zone that comprises:
   between 25 to 60 wt % platinum;
   8 and 20 wt % chromium; and
   up to 7.5 wt % aluminium.

2. The erosion protection coating according to claim 1, wherein the single phase outer zone further comprises between 20 to 40 wt % nickel.

3. The erosion protection coating according to claim 2, wherein the single phase outer zone further comprises between 0 to 5 wt % iron.

4. The erosion protection coating according to claim 1, wherein
   the single phase outer zone is between 4 and 30 microns thick.

5. The erosion protection coating according to claim 4, wherein
   the single phase outer zone is less than 20 microns thick.

6. The erosion protection coating according to claim 4, wherein a maximum platinum diffusion zone is no more than 40 microns thick.

7. The erosion protection coating according to claim 5, wherein the turbine blade comprises nickel alloy.

8. An erosion protection coating on a gas turbine engine turbine blade that is mounted in a root slot of a turbine disc, the coating comprising:
   platinum; and
   a single gamma phase outer zone
   that comprises between 8 and 30 wt % chromium and up to 7.5 wt % aluminium.

9. The erosion protection coating according to claim 8, wherein the single phase outer zone comprises between 25 to 60 wt % platinum.

10. A method of providing a coating on a gas turbine engine nickel turbine blade, the method comprising:
    applying to the blade a coating of platinum,
    heat treating the blade to provide a platinum-enriched outer layer with a thickness between 5 microns and 30 microns,
    diffusing chromium into the platinum to form a single gamma phase outer zone comprising up to 7.5 wt % aluminium, and
    mounting the blade into a root slot of a turbine disc.

11. The method according to claim 10, wherein
    the platinum-enriched outer layer provided by the heat treatment is less than 20 microns.

12. The method according to claim 10, wherein
    the outer zone comprises between 8 and 30 wt % chromium.

* * * * *